United States Patent [19]

Ibuchi

[11] Patent Number: 5,028,952
[45] Date of Patent: Jul. 2, 1991

[54] APPARATUS FOR THE FORMATION OF IMAGES

[75] Inventor: Yoshiaki Ibuchi, Nara, Japan

[73] Assignee: Sharp Kabushiki Kaisha, Osaka, Japan

[21] Appl. No.: 405,619

[22] Filed: Sep. 7, 1989

[30] Foreign Application Priority Data

Sep. 9, 1988 [JP] Japan .............................. 63-227065

[51] Int. Cl.$^5$ ............................................. G03B 27/32
[52] U.S. Cl. ..................................................... 355/27
[58] Field of Search ..................... 355/27, 28, 35, 37; 430/138

[56] References Cited

U.S. PATENT DOCUMENTS

| 4,399,209 | 8/1983 | Sanders et al. | 430/138 |
| 4,624,560 | 11/1986 | Beery | 355/27 |
| 4,777,513 | 10/1988 | Nelson | 355/27 |
| 4,825,251 | 4/1989 | Nelson et al. | 355/125 X |
| 4,860,058 | 8/1989 | Kobayashi et al. | 355/27 |
| 4,939,535 | 7/1990 | Hashimoto et al. | 355/27 |

FOREIGN PATENT DOCUMENTS 1-235952 9/1989 Japan .

Primary Examiner—A. A. Matthews
Assistant Examiner—Khanh Dang
Attorney, Agent, or Firm—Irell & Manella

[57] ABSTRACT

An apparatus for the formation of images comprising a lamp which is disposed below a photosensitive sheet staying at a buffer section and which is turned on during the period of a light-exposure step, and a light-blocking plate which directs the light from the lamp into a portion of said photosensitive sheet between a pressure-transfer section and the front end of a latent image, whereby pressure-rupturable capsules on a non-image area of the photosensitive sheet are hardened and do not rupture when pressurized at the pressure-transfer section, thereby preventing chromogenic materials contained therein from flowing out onto the pressure rollers ore other devices, preventing the pressure rollers and/or the inside of the apparatus body from being stained with the chromogenic materials, and preventing the photosensitive sheet from becoming crumpled or from causing jamming.

2 Claims, 4 Drawing Sheets

APPARATUS FOR THE FORMATION OF IMAGES

BACKGROUND OF THE INVENTION

1. Field of the invention

This invention relates to an apparatus for the formation of images in which a photosensitive sheet coated with pressure-rupturable capsules containing chromogenic materials is first exposed to light at a light-exposure section to obtain a latent image and then is brought together with an image-receiving sheet coated with developing materials at a pressure-transfer section to be pressurized, thereby allowing the chromogenic materials to react with the developing materials to obtain a colored image on the image-receiving sheet, and more particularly relates to an apparatus for the formation of images in which the portion of the photosensitive sheet that has passed through the light-exposure section temporarily stays at a buffer section before being transported into the pressure-transfer section.

2. Description of the prior art

An apparatus for the formation of images in which a photosensitive sheet coated with pressure-rupturable capsules containing chromogenic materials is first exposed to light to obtain a latent image and then is pressed against an image-receiving sheet coated with a developing materials to obtain a colored image on the image-receiving sheet has been proposed by, for example, Japanese Laid-Open Patent Publication No. 58-88739.

The image-forming process in such an apparatus comprises two steps; a light-exposure step and a pressure-transfer step. In the light-exposure step, the photosensitive sheet, one side of which is coated with pressure-rupturable capsules containing chromogenic materials that are hardened when exposed to light, is first transported into a light-exposure section, where it is exposed to light reflected from an original. The light reflected from the original selectively illuminates the pressure-rupturable capsules on the photosensitive sheet so that some of the capsules receive the light and become hardened, while others do not receive the light and are left unchanged, resulting in a latent image corresponding to the image of the original. Then, in the pressure-transfer step, the photosensitive sheet on which the latent image has been formed is transported into the pressure-transfer section, where the photosensitive sheet is placed together with the image-receiving sheet and pressure is applied thereto. Thus, the pressure-rupturable capsules that have not been hardened rupture, allowing the chromogenic materials contained therein to flow out onto the image-receiving sheet. Then, the chromogenic materials react with the developing materials coated on the image-receiving sheet, which gives rise to color in the chromogenic materials, resulting in a colored image corresponding to the latent image on the image-receiving sheet. In general, the pressure-transfer section consists of a pair of pressure rollers, between which the photosensitive sheet and the image-receiving sheet are supplied at the same time to be pressurized.

In the light-exposure step mentioned above, the speed at which the photosensitive sheet is transported through the light-exposure section determines the light-exposure time, which influences the quality of a latent image to be formed on the photosensitive sheet. Similarly, in the pressure-transfer step mentioned above, the speed at which the photosensitive sheet is transported through the pressure-transfer section determines the time of the reaction between the chromogenic materials and the developing materials. The reaction time influences the quality of a colored image to be formed on the image-receiving sheet. In order to obtain a distinct colored image, the photosensitive sheet should be transported through the light-exposure section at the optimum speed (hereinafter referred to as "the optimum light-exposure speed") so that a latent image can be properly formed with the optimum light-exposure time, and then should be transported through the pressure-transfer section at the optimum speed (hereinafter referred to as "the optimum pressure-transfer speed") so that a colored image can be properly formed with the optimum reaction time. In general, the optimum light-exposure speed is different from the optimum pressure-transfer speed. If the photosensitive sheet is continuously transported through the light-exposure section and the pressure-transfer section, it can only be transported at the same speed through those two sections. Thus, the sheet-transporting speed cannot be set at the respective optimum level for each section.

To solve the above-mentioned problem, an apparatus for the formation of images has been proposed by, for example, Japanese Patent Application No. 63-64426 in which the photosensitive sheet is first transported from the roll of the sheet through the light-exposure section to a buffer section at the optimum light-exposure speed and temporarily stays at the buffer section between the light-exposure section and the pressure-transfer section, and is finally transported from the buffer section into the pressure-transfer section at the optimum pressure-transfer speed.

In such an apparatus, the sheet-transportation speed can be set at respective optimum levels for the light-exposure section and the pressure-transfer section, as mentioned above. This makes it possible to properly form a latent image on the photosensitive sheet and a distinct colored image on the image-receiving sheet.

The photosensitive sheet, however, has non-image areas between image-forming areas on which latent images are to be formed. As mentioned above, the pressure-rupturable capsules on the image-forming areas are exposed to light reflected from an original at the light-exposure section so that a considerable number of them are hardened to obtain a latent image. On the other hand, the pressure-rupturable capsules on the non-image areas are not exposed to light at the light-exposure section, so that none of them are hardened. When those unhardened capsules on the non-image areas are transported into the pressure-transfer section, they are pressurized to rupture so that the chromogenic materials flow out onto the pressure rollers or other components within the body of the apparatus, causing the pressure rollers and/or the inside of the body of the apparatus to be stained with the chromogenic materials. This interferes with the smooth operation of the whole apparatus. Moreover, since the image-forming areas have a large number of hardened capsules while the non-image areas have no hardened capsules, the rigidity of the image-forming areas are far greater than that of the non-image areas, and the surface of the non-image areas is far smoother than that of the image-forming areas. This difference in rigidity and smoothness between the image-forming areas and the non-image areas prevents the photosensitive sheet from being smoothly transported, causing the sheet to be crumpled. This may cause the whole apparatus to be jammed by the photosensitive sheet.

One way to solve the above-mentioned problem is to illuminate the non-image areas with use of a lamp or the like. It is, however, difficult to accurately direct the light to the area between the back end of one image-forming area and the front end of the next image-forming area while the photosensitive sheet is being transported. The light cannot be directed onto the non-image area without interfering with the image-forming areas adjacent thereto. If the transportation of the photosensitive sheet is suspended so that the light is accurately directed to the non-image area, the time required for the formation of images increases, which prevents the high-speed operation of the whole apparatus.

SUMMARY OF THE INVENTION

The apparatus for the formation of images of this invention, which overcomes the above-discussed and numerous other disadvantages and deficiencies of the prior art, is an apparatus in which a photosensitive sheet is transported through a light-exposure section into a buffer section during the period of a light-exposure step, temporarily stays in the form of a loop at said buffer section, and then is transported from a buffer section into a pressure-transfer section during the period of a pressure-transfer step, said photosensitive sheet being exposed to light by means of a light-emitting means to obtain a latent image at said light-exposure section, said apparatus comprising: a lamp which is disposed below said photosensitive sheet staying at said buffer section and which is turned on during the period of said light-exposure step, and a light-blocking plate which directs the light from said lamp onto a portion of said photosensitive sheet between said pressure-transfer section and the front end of said latent image.

In a preferred embodiment, the light-blocking plate directs the light from said lamp into a portion of said photosensitive sheet between said pressure-transfer section and the front end of a latent image to be formed at the lowest magnification.

In a preferred embodiment, it further comprises an illuminating means that illuminates a portion of said photosensitive sheet between the front end of a latent image to be formed at the lowest magnification and the front end of a latent image to be formed at the highest magnification or at a magnification between the lowest and the highest at the beginning of said light-exposure step.

In a preferred embodiment, the illuminating means comprises said light-emitting means and reflecting means, the light from said light-emitting means being reflected from said reflecting means to be directed to said portion of said photosensitive sheet between the front end of a latent image to be formed at the lowest magnification and the front end of a latent image to be formed at the highest magnification or at a magnification between the lowest and the highest at the beginning of said light-exposure step.

Thus, the invention described herein makes possible the objective of providing an apparatus for the formation of images in which a non-image area of a photosensitive sheet is exposed to light before being transported into a pressure-transfer section, so that the pressure-rupturable capsules thereon are hardened and do not rupture when pressurized at the pressure-transfer section, thereby preventing chromogenic materials contained therein from flowing out onto pressure rollers or other devices, preventing the pressure rollers and/or the inside of the body of the apparatus from being stained with the chromogenic materials, and preventing the photosensitive sheet from being crumpled or from causing jamming.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

EXAMPLE 1

Figure 2:
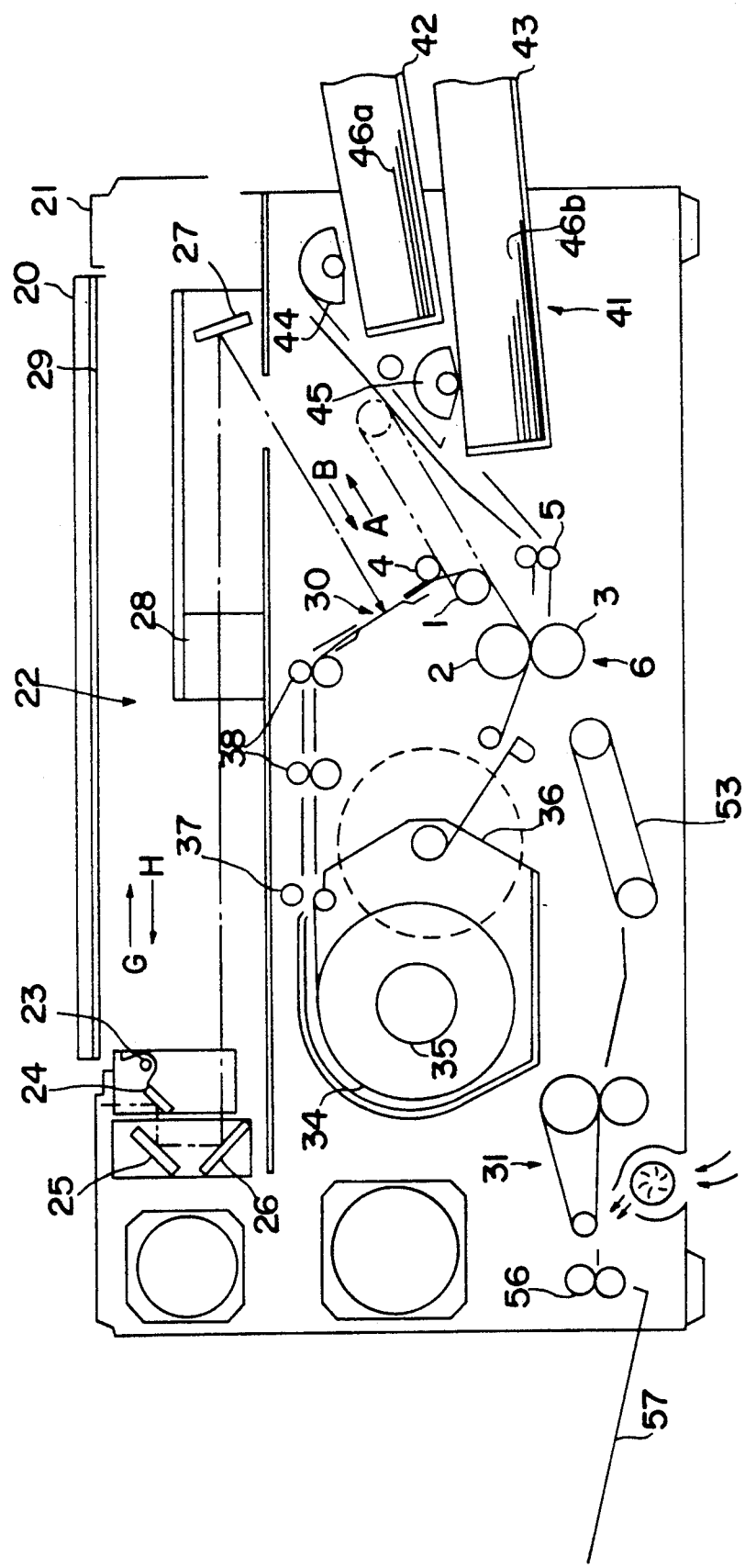
FIG. 2 is a front sectional view showing the apparatus for the formation of images of the invention.

FIG. 2 shows an apparatus for the formation of images of the invention, which comprises a body 21, in the substantial center of which a photosensitive sheet 34 wound around a sheet-feeding rod 35 into a roll is disposed. The photosensitive sheet 34 is drawn out from the sheet-feeding rod 35, directed through rollers 37 and 38 into a light-exposure section 30, and transported through a roller 4 and a buffer roller 1 into a pressure-transfer section 6 which consists of pressure rollers 2 and 3, and then wound around a take up rod 36. One side of the photosensitive sheet 34 is coated with pressure-rupturable capsules containing chromogenic materials that are hardened when exposed to light.

Paper cassettes 42 and 43, which contain image-receiving sheets of predetermined sizes 46a and 46b, respectively, are attached to one side of the body 21. The paper cassettes 42 and 43 are provided with paper supply rollers 44 and 45, respectively, all constituting a paper supply section 41. The image-receiving sheet is coated with developing materials which react with the above-mentioned chromogenic materials to give rise to color images.

Before an image-forming process starts, the paper supply roller 44 or 45 is selected to be driven, so that the respective image-receiving sheet 46a or 46b is transported into a pair of resist rollers 5. At the time of a pressure-transfer step described below, the resist rollers 5 rotate to convey the image-receiving sheet 46a or 46b into the pressure-transfer section 6, where the front end of the image-receiving sheet 46a or 46b is precisely disposed on the front end of an image-forming area on the photosensitive sheet 34.

On the top surface of the body 21 is provided a plate 29 made of hard transparent glass, on which an original to be copied is placed. The upper surface of the plate 29 can be covered with a cover 20. An optical system 22 including a light-emitting device 23, mirrors 24, 25, 26, and 27, and a lens 28 is disposed below the plate 29. The light-emitting device 23 and the mirrors 24, 25, and 26 of the optical system 22 move under the plate 29 in the direction of arrow G and H so as to scan the image of the original placed on the plate 29. At a light-exposure step, the light emitted from the light-emitting device 23 is reflected from the original, and then directed to the light-exposure section 30 via the mirrors 24, 25, 26, 27, and the lens 28 as shown by a dash-dot line in FIG. 2, thereby selectively illuminating an image-forming area of the photosensitive sheet 34. Accordingly, some of the pressure-rupturable capsules on the image-forming area receive the light and become hardened, while others do not receive the light and remain unchanged, resulting in a latent image corresponding to the image of an original. During the period of this light-exposure step, the buffer roller 1 moves in the direction of arrow A at a speed which is half as high as the optimum light-exposure speed V1. Thus, the photosensitive sheet 34 passes through the light-exposure section 30 at the optimum light-exposure speed V1 so that the latent image can be properly formed.

Thereafter, in the pressure-transfer step, the pressure rollers 2 and 3 rotate to move the buffer roller 1 in the direction of arrow B, so that the photosensitive sheet 34 on which the latent image has been formed is transported into the pressure-transfer section 6, where at the same time the image-receiving sheet 46a or 46b is also supplied as described above. The two sheets are pressed against each other so that the pressure-rupturable capsules on the photosensitive sheet 34 that have not been hardened rupture to allow the chromogenic materials therein to flow out onto the image-receiving sheet 46a or 46b. The chromogenic materials react with the developing materials coated on the image-receiving sheet 46a or 46b, thereby a colored image corresponding to the latent image being formed on the image-receiving sheet 46a or 46b. During this pressure-transfer step, the pressure rollers 2 and 3 rotate to move the buffer roller 1 in the direction of arrow B in such a manner that the photosensitive sheet 34 is transported at the optimum pressure-transfer speed V2. Thus, a distinct colored image can be obtained.

After the formation of the colored image, the image-receiving sheet 46a or 46b is transported by a conveyer 53 into a glossing device 31, where the colored image on the image-receiving sheet 46a or 46b is made glossy. The image-receiving sheet 46a or 46b is then transported by a pair of paper discharge rollers 56 out of the body 21 onto a paper receiving tray 57.

Figure 1:
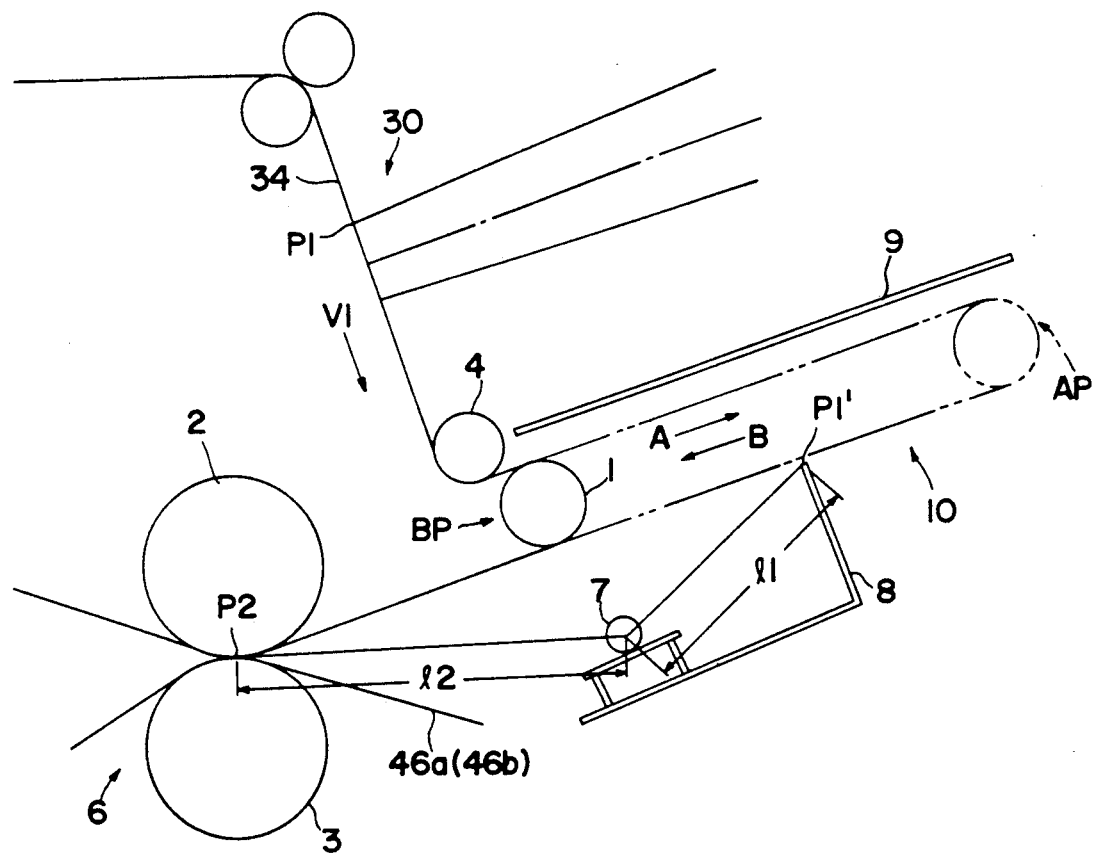
FIG. 1 is a schematic diagram showing the sheet-transporting operation of an apparatus for the formation of images of the invention.

FIG. 1 shows the sheet-transporting operation of the apparatus of the invention.

The buffer roller 1, which is disposed between the light-emitting section 30 and the pressure-transfer section 6, can be moved in the direction of arrows A and B as mentioned above. During the period of the light-exposure step, the buffer roller 1 is moved from its base position BP shown by a solid line in the direction of arrow A into a position AP shown by a line of dashes and double dots. During the period of the pressure-transfer step, the buffer roller 1 is moved from the position AP in the direction of arrow B into the base position BP.

At the beginning of the light-exposure step, the buffer roller 1 is at its base position BP, and the front end of an image-forming area of the photosensitive sheet 34 is located at an exposure-starting position P1. When the light-exposure step starts, the buffer roller 1 is moved in the direction of arrow A so that the image-forming area of the photosensitive sheet 34 moves from the exposure-starting position P1 and passes through the light-exposure section 30, resulting in a latent image. When the buffer roller 1 reaches the position AP, the photosensitive sheet 34 including the image-forming area on which the latent image has been formed stays at a buffer section 10 in the form of a loop as shown by a line of dashes and double dots. The front end of the image forming area (the latent image) is located at an exposure-ending position P1'. The back end of the previous latent image is located at the pressurizing position P2 of the pressure-transfer section 6. Thus, a non-image area on which no latent image is formed is located between the pressurizing position P2 and the exposure-ending position P1'. Since the length of the image-forming area is usually longer than that of the non-image area for the purpose of effective use of the photosensitive sheet, the non-image area is on the lower side of the loop, as shown in FIG. 1.

Below the lower side of the loop of the photosensitive sheet 34 is provided a lamp 7 and a light-blocking plate 8. The light-blocking plate 8 is so arranged that the light from the lamp 7 is directed to the non-image area between the pressurizing position P2 and the exposure-ending position P1'.

While the buffer roller 1 is moved in the direction of arrow A in the light-exposure step, the lamp 7 is turned on so as to illuminate the non-image area. As a result, the pressure-rupturable capsules on the non-image area of the photosensitive sheet 34 that is between the back end of the previous latent image and the front end of the present latent image are hardened.

The front portion of the non-image area, which is between the pressurizing position P2 and the base position BP of the buffer roller 1, is illuminated by the lamp 7 from the beginning of the light-exposure step. On the other hand, the back portion of the non-image area, which is between the base position BP and the exposure-ending position P1', is illuminated only after a predetermined period of time has elapsed, since this portion is first located in the vicinity of the exposure-starting position P1 at the beginning of the light-exposure step. As a result, the light from the lamp 7 illuminates the front portion of the non-image area for a longer period of time than it illuminates the back portion of the non-image area. If the lamp 7 illuminates the entire non-image area with a uniform intensity, the total amount of light received by the front portion is greater than that received by the back portion. In order to prevent this difference in the amount of light received by the front and the back portions, the lamp 7 is located at a distance l2 away from the pressurizing position P2 and at a distance l1 away from the exposure-ending position P1', so that the intensity of the light directed to the front portion can be lower than that directed to the back portion, thereby the amount of light received by the former being equal to that received by the latter. In this way, the entire portion of the non-image area receives uniform amount of light from the lamp 7, resulting in that the pressure-rupturable capsules on the non-image area are uniformly hardened.

As mentioned above, in an apparatus for the formation of images of this example, the entire portion of a non-image area can be illuminated by the lamp, so that the pressure-rupturable capsules thereon are hardened. Thus, the pressure-rupturable capsules thereon will not rupture when the non-image area passes through the pressure-transfer section, so that the chromogenic materials do not flow out onto the pressure rollers or other devices within the body of the apparatus. Thus the pressure rollers and/or the inside of the apparatus body is not stained with the chromogenic materials. The smooth operation of the apparatus can be accordingly assured. Moreover, there is little difference in rigidity or smoothness between the image-forming areas and the non-image areas since the pressure-rupturable capsules on the non-image areas are also hardened. This allows the photosensitive sheet to be smoothly transported, prevents it from being crumpled, and thus prevents the whole apparatus from being jammed with the photosensitive sheet.

EXAMPLE 2

Figure 3:
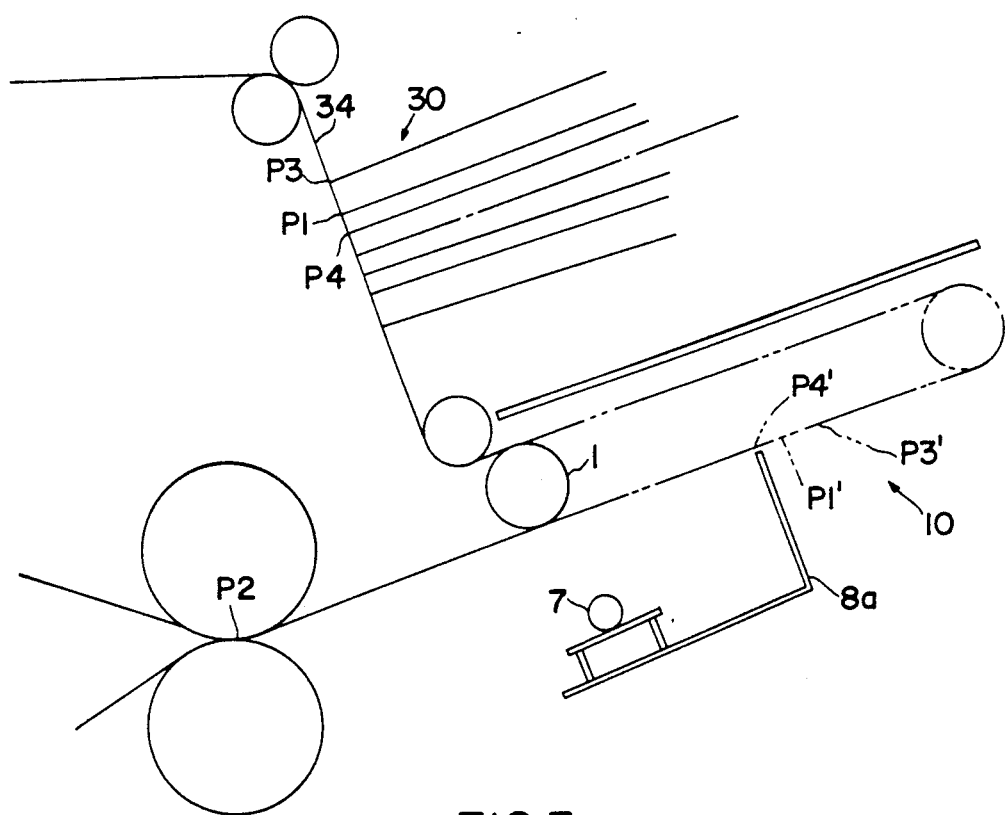
FIG. 3 is a schematic diagram showing the sheet-transporting operation of another apparatus for the formation of images of the invention.
Figure 4:
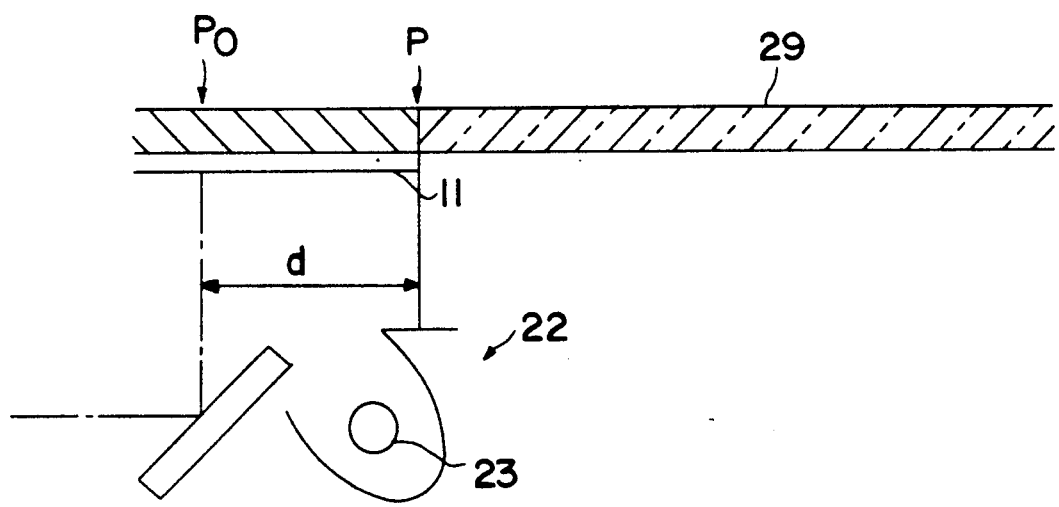
FIG. 4 is a schematic diagram showing the vicinity of an optical system of the apparatus of FIG. 3.

FIGS. 3 and 4 show another apparatus for the formation of images of the invention, in which magnification can be changed Referring to FIG. 3, an exposure-starting position, at which the front end of an image-forming area is located at the beginning of the light-exposure step, ranges from a position P3 to a position P4, in accordance with the changes in magnification of images. When the highest magnification is selected (highest magnification mode), the exposure-starting position is located at P3. When the lowest magnification is selected (lowest magnification mode), the exposure-starting position is at P4. With this change in the exposure-starting position, an exposure-ending position, at which the front end of a latent image will be located at the end of the light-exposure step, varies from a position P3' to a position P4', and accordingly the length of the non-image area changes. If the light-blocking plate 8a is moved in accordance with this change so that the lamp 7 illuminates the entire portion of the non-image area, the structure of the apparatus becomes complicated and it is difficult to produce such an apparatus.

In order to illuminate the entire non-image area that varies in magnification, the apparatus of this example comprises two illuminating means for illuminating different portions of the non-image area, as will be described below.

When the apparatus is operated in the lowest magnification mode, the front end of the resultant latent image at the lowest magnification is located at the position P4' at the end of the light-exposure step, so that the non-image area is located between the pressurizing position P2 and the position P4'. This non-image area (hereinafter referred to as "the first non-image area") is illuminated by the use of the lamp 7 and a light-blocking plate 8a in the same way as in Example 1. As shown in FIG. 3, the light-blocking plate 8a is so located that the light from the lamp 7 is directed to the first non-image area. In the light-exposure step, the lamp 7 is turned on and illuminates the first non-image area, allowing the pressure-rupturable capsules thereon to be hardened. Thus, when the apparatus is operated in the lowest magnification mode, the non-image area can be illuminated by the lamp 7 during the period of the light-exposure step.

However, when the apparatus is operated in a mode other than the lowest magnification mode, the front end of the resultant latent image is located at a certain position between the positions P4' and P3' or at the position P3'. Thus, in this case, the non-image area is between the pressurizing position P2 and the "certain position" just mentioned above. This non-image area includes the above-mentioned first non-image area, which is between the pressurizing position P2 and the position P4' and thus illuminated by the lamp 7 during the period of the light-exposure step. However, the other portion of the non-image area, which is between the position P4' and the above-mentioned "certain portion", cannot be illuminated by the lamp 7.

In this example, the above-mentioned remaining area between the position P4' and the "certain position" (hereinafter referred to as "the second non-image area") is illuminated at the beginning of the light-exposure step as follows: As shown in FIG. 3, at the beginning of the light-exposure step, the second non-image area is located between the position P4 and a certain position between the positions P4 and P3. This second non-image area is illuminated by means of the light-emitting device 23 of the optical system 22 at the beginning of the light-exposure step as will now be described. Referring to FIG. 4, when the light-emitting device 23 of the optical system 22 moves horizontally under the plate 29 to scan the image of an original at the time of the light-exposure step, it starts from the position $P_o$ and gradually accelerates until it comes to the position P, from which it moves at a fixed speed under the plate 29 to scan the original. This acceleration length d between the positions $P_o$ and P is set to be slightly longer than the length between the positions P3 and P4. A white plate 11 is disposed above the light-emitting device 23 in such a manner that the light emitted from the latter can be reflected by the former during the period of the above-mentioned accelerated movement. Thus, at the beginning of the light-exposure step, while the light-emitting device 23 is moving at an increasing speed from the position $P_o$ to the position P, the light from the light-emitting device 23 is reflected by the white plate 11 and then is directed to the second non-image area. In this way, the second non-image area between the position P4 and a certain position between the positions P4 and P3 can be illuminated by the light-emitting device 23 at the beginning of the light-exposure step.

Therefore, in an apparatus of this example, the entire non-image area including the first and second non-image areas is exposed to light so that the pressure-rupturable capsules thereon are hardened, regardless of the ratios of reduction or enlargement of images. Thus, the apparatus of this example also attains the same effect as described in Example 1.

When the distance between the position P1 (the exposure-starting position in the real-size copying mode) and the position P4 (the exposure-starting position in the lowest magnification mode) is extremely small, this portion of the photosensitive sheet 34 can be considered as "front-end void portion" and can dispense with the above-mentioned irradiation with the light-emitting device. The acceleration length of the light-emitting device mentioned above can be made shorter by the length of this portion. Even in this case, the same effect as in the above-mentioned examples can be attained.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In an apparatus for the formation of images, in which a photosensitive sheet is transported through a light-exposure section into a buffer section during the period of a light-exposure step, temporarily stays in the form of a loop at said buffer section, and then is transported from a buffer section into a pressure-transfer section during the period of a pressure-transfer step, said photosensitive sheet being exposed to light by means of a light-emitting means to obtain a latent image at said light-exposure section, said apparatus comprising:

- a lamp which is disposed below said photosensitive sheet staying at said buffer section and which is turned on during the period of said light-exposure step, and
- a light-blocking plate which directs the light from said lamp onto a portion of said photosensitive sheet between said pressure-transfer section and the front end of said latent image;

wherein said light-blocking plate directs the light from said lamp onto a portion of said photosensitive sheet between said pressure-transfer section and the front end of a latent image to be formed at the lowest magnification;

which apparatus further comprises an illuminating means that illuminates a portion of said photosensitive sheet between the front end of a latent image to be formed at the lowest magnification and the front end of a latent image to be formed at the highest magnification or at a magnification between the lowest and the highest at the beginning of said light-exposure step.

2. An apparatus according to claim 1, wherein said illuminating means comprises said light-emitting means and reflecting means, the light from said light-emitting means being reflected from said reflecting means to be directed to said portion of said photosensitive sheet between the front end of a latent image to be formed at the lowest magnification and the front end of a latent image to be formed at the highest magnification or at a magnification between the lowest and the highest at the beginning of said light-exposure step.

* * * * *